United States Patent
Goldman

(10) Patent No.: US 7,639,070 B2
(45) Date of Patent: Dec. 29, 2009

(54) SWITCHING CIRCUIT IN A PHASE LOCKED LOOP (PLL) TO MINIMIZE CURRENT LEAKAGE IN INTEGRATED CIRCUITS

(75) Inventor: Stanley J. Goldman, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/020,691

(22) Filed: Jan. 28, 2008

(65) Prior Publication Data

US 2009/0189659 A1     Jul. 30, 2009

(51) Int. Cl.
*H03B 1/00* (2006.01)
*H03K 5/00* (2006.01)
*H04B 1/10* (2006.01)

(52) U.S. Cl. ....................... 327/552; 156/563

(58) Field of Classification Search ................. 327/156, 327/147, 148, 157
See application file for complete search history.

(56) References Cited

U.S. PATENT DOCUMENTS

| | | |
|---|---|---|
| 6,611,176 B1 | 8/2003 | Goldman |
| 6,650,195 B1 * | 11/2003 | Brunn et al. ............. 331/177 V |
| 6,774,731 B2 * | 8/2004 | Magazzu et al. ............. 331/17 |
| 2005/0218948 A1 * | 10/2005 | Zhu et al. .................... 327/157 |

* cited by examiner

*Primary Examiner*—Lincoln Donovan
*Assistant Examiner*—Daniel Rojas
(74) *Attorney, Agent, or Firm*—Wade J. Brady, III; Frederick J. Telecky, Jr.

(57) ABSTRACT

In an apparatus and method for reducing current leakage in a phase locked loop (PLL), a pair of resistive divider circuit is coupled to receive a pair of differential input signals and provide a pair of differential output signals. A timing control circuit controls a pair of switches, the pair of switches being operable to conduct the pair of differential output signals in response to at least one signal of the pair of differential input signals being present. An operational amplifier (OA) includes a pair of OA input terminals and an OA output terminal. The pair of OA input terminals is coupled to receive the pair of differential output signals conducted by the pair of switches. A feedback circuit is coupled between the OA output terminal and a first one of the pair of OA input terminals. The pair of switches is disabled by the timing control circuit to block a current leakage from the feedback circuit.

15 Claims, 7 Drawing Sheets

SWITCHING CIRCUIT IN A PHASE LOCKED LOOP (PLL) TO MINIMIZE CURRENT LEAKAGE IN INTEGRATED CIRCUITS

BACKGROUND

The present invention is related in general to the field of electronic circuits, and more specifically to an apparatus and method for reducing current leakage in a phase locked loop (PLL).

A PLL is a well-known electronic circuit used in many semiconductor devices. A PLL is a closed loop feedback control circuit which provides an output signal that is locked in phase and frequency of an input signal used as a reference. The PLL typically includes a phase frequency detector (PFD), a charge pump (CP), a loop filter, a voltage-controlled oscillator (VCO), and an optional divider. The PFD compares a feedback signal received from the divider with a reference signal and generates an error signal, which is proportional to the magnitude of the phase/frequency difference between them. The error signal is provided to the CP. In some PLL circuits, the functionality of the CP may be combined with the PFD. The CP provides a current output, which is typically output in the form of current pulses in response to a positive or negative error signal. The current output of the CP controls a magnitude of the charge stored in the loop filter, thus converting the output of the PFD to a control voltage input recognizable by the VCO. The VCO generates an output frequency signal proportional to the control voltage input. The output frequency signal may be optionally further divided down by the divider before being fed back to the PFD. When the PLL is in a "locked" state, there is a constant phase difference (usually zero) between the feedback signal and a reference signal and their frequencies are matched.

Active compensation circuits for the loop filter (or in some cases the CP) have been included in the PLL to increase its performance measured in terms of an improved loop stability, increased gain, narrower loop bandwidth, and higher noise immunity compared to traditional charge pump compensation methods. One such active compensation based PLL circuit (also referred to as an active compensation PLL) is described in further detail in the following U.S. patent, which is hereby incorporated by reference into this specification: U.S. Pat. No. 6,611,176 entitled 'Method and apparatus for two zeros/two poles active compensation phase locked loops'. A key limitation in many traditional active compensation PLL circuits is a presence of higher than tolerable current leakage. This phenomenon is often detrimental to the PLL performance.

SUMMARY

Applicant recognizes that newer and faster technologies are being used to fabricate chips having reduced geometries. Along with reduced dimensions, these technologies also generally result in producing capacitors and transistors that have increased parasitic effects and increased current leakage. In an active compensation based loop filter of a traditional PLL, the current leakage path for a charge stored on the capacitor includes the series resistors (the capacitor and the series resistors being included in the compensation circuit) and the grounded output of the phase detector (PD). In a compensation based charge pump in a traditional PLL, the current leakage path for the charge stored on the capacitor includes the series resistors (included in the compensation circuit) and the CP output impedance (approximately 10 kilo ohms) and the control line to the VCO. An undesirable effect of current leakage on the performance of the PLL is a presence of reference sidebands (also referred to as reference spurs), thereby resulting in an unusable wideband spectrum.

Applicant recognizes that it would be desirable to retain the benefits of active compensation PLL but without incurring a substantial penalty on the current leakage and PLL performance. Applicant further recognizes that it would be desirable to substantially reduce the current leakage and hence reduce the reference sideband levels, e.g., by at least 30-40 dB, thereby reducing the unusable wideband modulation signal to a narrow band modulation signal. Therefore, it would be desirable to provide an improved active compensation PLL having reduced current leakage and improved performance, absent the disadvantages found in the prior methods discussed above.

The foregoing needs are addressed by the teachings of the present disclosure, which relates to an apparatus and method for an improved active compensation PLL circuit having reduced current leakage through capacitors and transistors. According to one embodiment, in an apparatus and method for reducing current leakage in a phase locked loop (PLL), a pair of resistive divider circuit is coupled to receive a pair of differential input signals and provide a pair of differential output signals. A timing control circuit controls a pair of switches, the pair of switches being operable to conduct the pair of differential output signals in response to at least one signal of the pair of differential input signals being present. An operational amplifier (OA) includes a pair of OA input terminals and an OA output terminal. The pair of OA input terminals is coupled to receive the pair of differential output signals conducted by the pair of switches. A feedback circuit is coupled between the OA output terminal and a first one of the pair of OA input terminals. The pair of switches is disabled by the timing control circuit to block a current leakage from the feedback circuit.

In one aspect of the disclosure, a method for reducing current leakage in a phase locked loop (PLL) includes detecting a presence of at least one signal of a pair of input differential signals. A conductive path for at least a portion of the pair of input differential signals is enabled in response to the at least one signal being present, the conductive path providing a charge to at least one energy storing element of the PLL. The conductive path is disabled after a configurable delay in response to the at least one signal being absent, the conductive path being disabled after the configurable delay to block the current leakage from the at least one energy storing element. The pair of input differential signals is proportioned to provide a pair of differential output signals in response to the conductive path being enabled.

In another aspect of the disclosure, an active compensation phased lock loop (PLL) having a reduced current leakage includes a phase detector (PD) to compare a feedback signal and a reference signal, the PD generating an error signal corresponding to a difference between the feedback signal and the reference signal. An active loop filter of the PLL includes a pair of resistive divider circuit that is coupled to receive a pair of differential input signals and provide a pair of differential output signals. A timing control circuit controls a pair of switches, the pair of switches being operable to conduct the pair of differential output signals in response to at least one signal of the pair of differential input signals being present. An operational amplifier (OA) includes a pair of OA input terminals and an OA output terminal. The pair of OA input terminals is coupled to receive the pair of differential output signals conducted by the pair of switches. A feedback circuit is coupled between the OA output terminal and a first one of the pair of OA input terminals. The pair of switches is disabled by the timing control circuit to block a current leakage from the feedback circuit. The PLL having the reduced current leakage also includes a voltage controlled oscillator (VCO) having a VCO input and a VCO output. The VCO input is coupled to the OA output terminal, the VCO output being used to derive the feedback signal. A blockage of the current leakage causes the current leakage to reduce, thereby resulting in the VCO output having reduced reference sideband levels compared to a PLL without the pair of switches.

Several advantages are achieved by the method and apparatus according to the illustrative embodiments presented herein. The embodiments provide an improved active compensation PLL that retains the benefits of the traditional active compensation PLL such as improved loop stability, increased gain, narrower loop bandwidth, and higher noise immunity, and in addition advantageously reduces the current leakage, thereby improving the PLL performance. A pair of switches is used to advantageously block the leakage current when there is no signal from the PD, thereby reducing the current leakage and substantially reducing presence of reference sidebands by approximately 38 dB. The virtual elimination of the reference sidebands, which are present in a traditional PLL without the pair of switches, substantially reduces an unusable wideband modulation signal generated by the PLL without the pair of switches to a usable narrow band modulation signal.

DETAILED DESCRIPTION

Figure 1A:
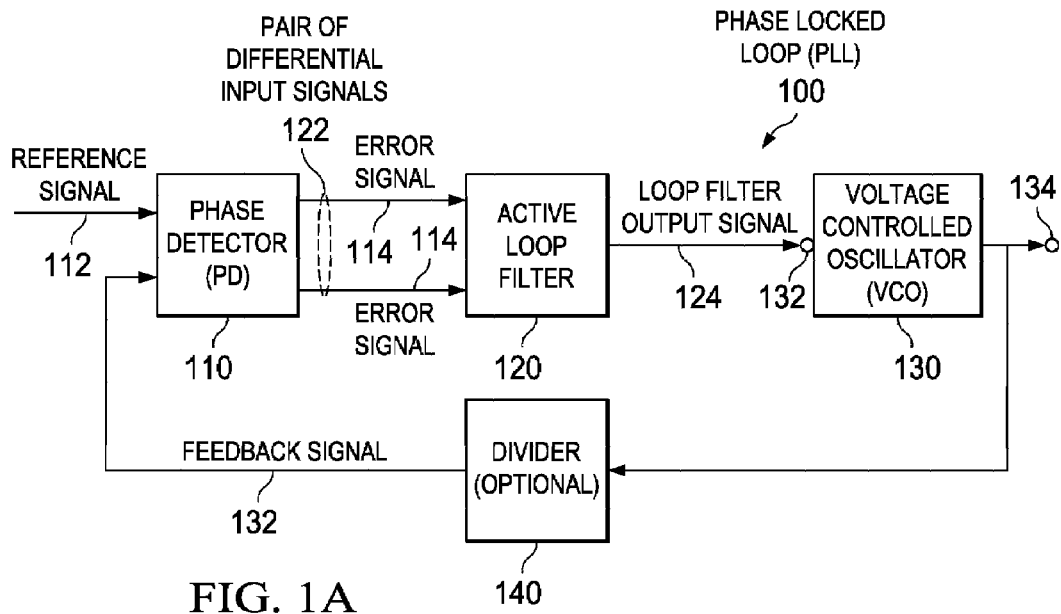
FIG. 1A illustrates a block diagram of an improved phase locked loop (PLL), according to an embodiment.

Novel features believed characteristic of the present disclosure are set forth in the appended claims. The disclosure itself, however, as well as a preferred mode of use, various objectives and advantages thereof, will best be understood by reference to the following detailed description of an illustrative embodiment when read in conjunction with the accompanying drawings. The functionality of various circuits, devices or components described herein may be implemented as hardware (including discrete components, integrated circuits and systems-on-a-chip 'SoC'), firmware (including application specific integrated circuits and programmable chips) and/or software or a combination thereof, depending on the application requirements.

Similarly, the functionality of various mechanical elements, members, or components for forming modules, subassemblies and assemblies assembled in accordance with a structure for an apparatus may be implemented using various materials and coupling techniques, depending on the application requirements. Descriptive and directional terms used in the written description such as top, bottom, left, right, and similar others, refer to the drawings themselves as laid out on the paper and not to physical limitations of the disclosure unless specifically noted. The accompanying drawings may not to be drawn to scale and some features of embodiments shown and described herein may be simplified or exaggerated for illustrating the principles, features, and advantages of the disclosure.

As described earlier, a traditional solution for improving loop stability and increased gain utilizes an active compensation based PLL circuit. However, the use of many of these traditional solutions is often limited due to a presence of higher than tolerable current leakage. Presence of the current leakage often has a detrimental effect on PLL performance such as generation of reference sidebands that result in an unusable wideband spectrum. Therefore, a need exists to provide a method and apparatus for an active compensation PLL having a reduced current leakage and an improved performance. This problem may be addressed by an improved apparatus and method for reducing the current leakage in the PLL.

According to one embodiment, in an apparatus and method for reducing current leakage in a phase locked loop (PLL), a pair of resistive divider circuit is coupled to receive a pair of differential input signals and provide a pair of differential output signals. A timing control circuit controls a pair of switches, the pair of switches being operable to conduct the pair of differential output signals in response to at least one signal of the pair of differential input signals being present. An operational amplifier (OA) includes a pair of OA input terminals and an OA output terminal. The pair of OA input terminals is coupled to receive the pair of differential output signals conducted by the pair of switches. A feedback circuit is coupled between the OA output terminal and a first one of the pair of OA input terminals. The pair of switches is disabled by the timing control circuit to block a current leakage from the feedback circuit.

The following terminology may be useful in understanding the present disclosure. It is to be understood that the terminology described herein is for the purpose of description and should not be regarded as limiting.

Semiconductor Device—A semiconductor device is an electronic component that utilizes electronic properties of semiconductor materials to perform a desired function. A semiconductor device may be manufactured as a single discrete device or as one or more integrated circuits (ICs) packaged into a module.

Configuration—Describes a set up of an element, a circuit, a package, an electronic device, and similar other, and refers to a process for setting, defining, or selecting particular properties, parameters, or attributes of the device prior to its use or operation. Some configuration attributes may be selected to have a default value. For example, a resistor divider circuit may be configured to have an output to input voltage signal ratio of 25%.

An apparatus in the form of an improved PLL that is operable to deliver the advantages of a traditional active compensation PLL and in addition provide a reduced current leakage and an improved performance compared to the traditional active compensation PLL is described with reference to FIGS. 1A, 1B, 1C, and 1D. Transient waveforms associated with the improved PLL illustrating a reduced current leakage are described with reference to FIGS. 2A, 2B, and 2C. The improved performance of the PLL is described with reference to FIGS. 3A and 3B. A method for reducing a current leakage in the improved PLL is described with reference to FIG. 4.

FIG. 1A illustrates a block diagram of an improved phase locked loop (PLL) 100, according to an embodiment. In the depicted embodiment, the PLL 100 includes a phase detector (PD) 110, an active loop filter 120 having circuitry to reduce current leakage, a voltage controlled oscillator (VCO) 130, and an optional divider 140. The PD 110 compares a feedback signal 132 received from the optional divider 140 with a reference signal 112 and generates an error signal 114 as an output, the error signal 114 being proportional to the magnitude of the phase/frequency difference between the two inputs. In the depicted embodiment, the error signal 114 is output as a pair of differential input signals 122. It is understood that in some PLL applications, the error signal 114 may be output as a single ended signal.

The error signal 114 may be in the form of plus (or up) and minus (or down) pulse signals corresponding to a positive or negative sign of the error. The error signal 114 may have varying pulse widths corresponding to a magnitude of the error. The active loop filter 120 provides the integration and filtering functions for the error signal 114 in the PLL 100. That is, the active loop filter 120 is coupled to receive the error signal 114 from the PD 110 as the pair of differential input signals 122 and provide a loop filter output signal 124 to the VCO 130. In a particular embodiment, the pair of differential input signals 122 are non-overlapping. That is, both signals of the pair of differential input signals 122 are not concurrently present. Additional details of the active loop filter 120, including the circuitry to reduce current leakage, is described with reference to FIG. 1B.

The VCO 130 is operable to generate an output frequency signal (e.g., the PLL output) at a VCO output 134 terminal, the output frequency signal being proportional to a voltage input signal provided to the VCO 130 at a VCO input 132 terminal. Thus, the pulse widths of the error signal 114 control an amount of the charge stored in the active loop filter 120, and consequently the voltage input signal provided to the VCO 130. The output frequency signal generated by the VCO 130 at the VCO output 134 terminal may be modified, e.g., divided by a configurable factor N, by the optional divider 140 to provide the feedback signal 132.

Figure 1B:
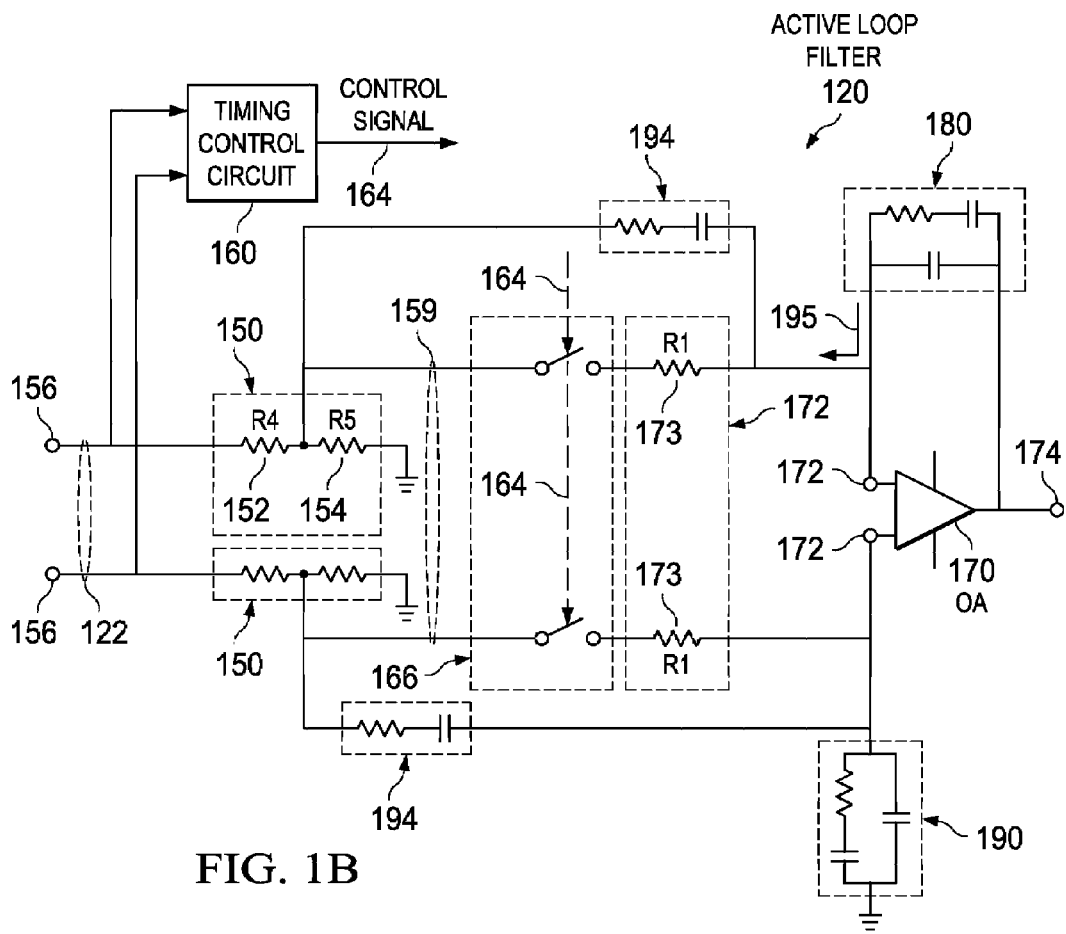
FIG. 1B illustrates a block diagram of an active loop filter described with reference to FIG. 1A, according an embodiment.

FIG. 1B illustrates a block diagram of an active loop filter 120 described with reference to FIG. 1A, according to an embodiment. In the depicted embodiment, the active loop filter 120 includes a pair of resistive divider circuit 150, a timing control circuit 160, an operational amplifier (OA) 170, a feedback circuit 180, a compensation circuit 190, a pair of differential input resistors 172, and a pair of third resistance and capacitor circuit 194.

The pair of resistive divider circuit 150 includes a pair of input terminals 156 to receive the pair of differential input signals 122. The pair of resistive divider circuit 150 provides a pair of differential output signals 159 that are in proportion to the pair of differential input signals 122. In a particular embodiment, each one of the pair of resistive divider circuit 150 includes resistors R4 152 and R5 154 to proportionally divide a corresponding one of the pair of differential input signals 122. Each R4 152 is coupled to a corresponding one of the pair of input terminals 156. Thus, the pair of resistive divider circuit 150 provides the pair of differential output signals 159, each across R5 154 and a voltage reference such as ground, and an output voltage across R5 154 is proportional to an input voltage across R4 152 and R5 154. The particular values for R4 152 and R5 154 may be configured to achieve a desired ratio of output to input signal.

The timing control circuit 160 is coupled to the pair of input terminals 156 to receive the pair of differential input signals 122. The timing control circuit 160 includes logic (not shown) to generate a control signal 164 to control each one of a pair of switches 166. In a particular embodiment, the pair of switches 166 are advantageously controllable by the timing control circuit 160 to be closed (conduct) when an input signal is present and to be open (block) when the input signal is not present, thereby blocking a conductive path 195 for a current leakage. That is, the pair of switches 166 are operable to conduct the pair of differential output signals 159 in response to at least one signal of the pair of differential input signals 122 being present and the pair of switches 166 are operable to block the pair of differential output signals 159 in response to both signals of the pair of differential input signals 122 being absent. Additional details of the timing control circuit 160, including the logic to control the pair of switches 166 is described with reference to FIG. 1C.

The operational amplifier (OA) 170 includes a pair of OA input terminals 172 and an OA output terminal 174. The pair of OA input terminals 172 is coupled to receive the pair of differential output signals 159 that are conducted by the pair of switches 166. The feedback circuit 180 is coupled between the OA output terminal 174 and a first one of the pair of OA input terminals 172. The feedback circuit 180 includes at least one energy storage element such as a capacitor. The pair of switches 166 are disabled (opened) to block a current leakage from the at least one energy storage element included in the feedback circuit 180.

The proportional ratio may be adjusted by configuring values for R4 152 and R5 154 to advantageously reduce a toggling effect on an OA output signal (same as the loop filter output signal 124) provided at the OA output terminal 174 in response to a change of both signals of the pair of differential input signals 122. In a particular embodiment, the proportional ratio (R4 152:R5 154) may be configurable between approximately 1:25 and approximately 1:3. Additionally, by reducing the size of the signal input, the OA 170 advantageously operates in a linear response region with a smaller pulsed input.

As described earlier, the conductive path 195 for the current leakage includes pair of differential input resistors R1 173, the pair of switches 166, and the grounded output of the phase detector (PD) 110 (not shown). The pair of switches 166 is disabled (opened) to advantageously block the path for the current leakage from the one or more energy storage elements in the active loop filter 120. The active loop filter 120 may include other active devices (such as transistors) that have parasitic effects, thereby contributing to the current leakage. Although the active loop filter 120 is shown to include an OA as an active device, it is understood that other types of active devices may also be included.

In the depicted embodiment, the pair of differential input resistors R1 173 are coupled between the pair of switches 166 and the pair of OA input terminals 172. The pair of third resistance and capacitor (R3 and C3) circuit 194, which is included to provide multi-pole multi-zero active compensation for the active loop filter 120, is coupled in parallel across a corresponding combination of the pair of switches 166 and the pair of differential input resistors R1 173. The pair of third resistance and capacitor circuit 194 does not provide a conductive path for the current leakage. Hence, it would not be desirable to include a pair of controlled switches in series. Simulation models used to simulate a performance of a PLL indicate that including a switch in series the pair of third resistance and capacitor (R3 and C3) circuit 194 causes additional transients that negatively impact the PLL performance.

The compensation circuit 190, which is also included to provide multi-pole multi-zero active compensation for the active loop filter 120, is coupled between a second one of the pair of OA input terminals 172 and a voltage reference such as ground. In the depicted embodiment, the compensation circuit 190 includes R2, C1 and C2 components. As described earlier, the pair of switches 166 is disabled to block the current leakage from energy storage elements (such as the capacitor) included in the compensation circuit 190 that is flowing through the pair of differential input resistors R1 173.

Figure 1C:
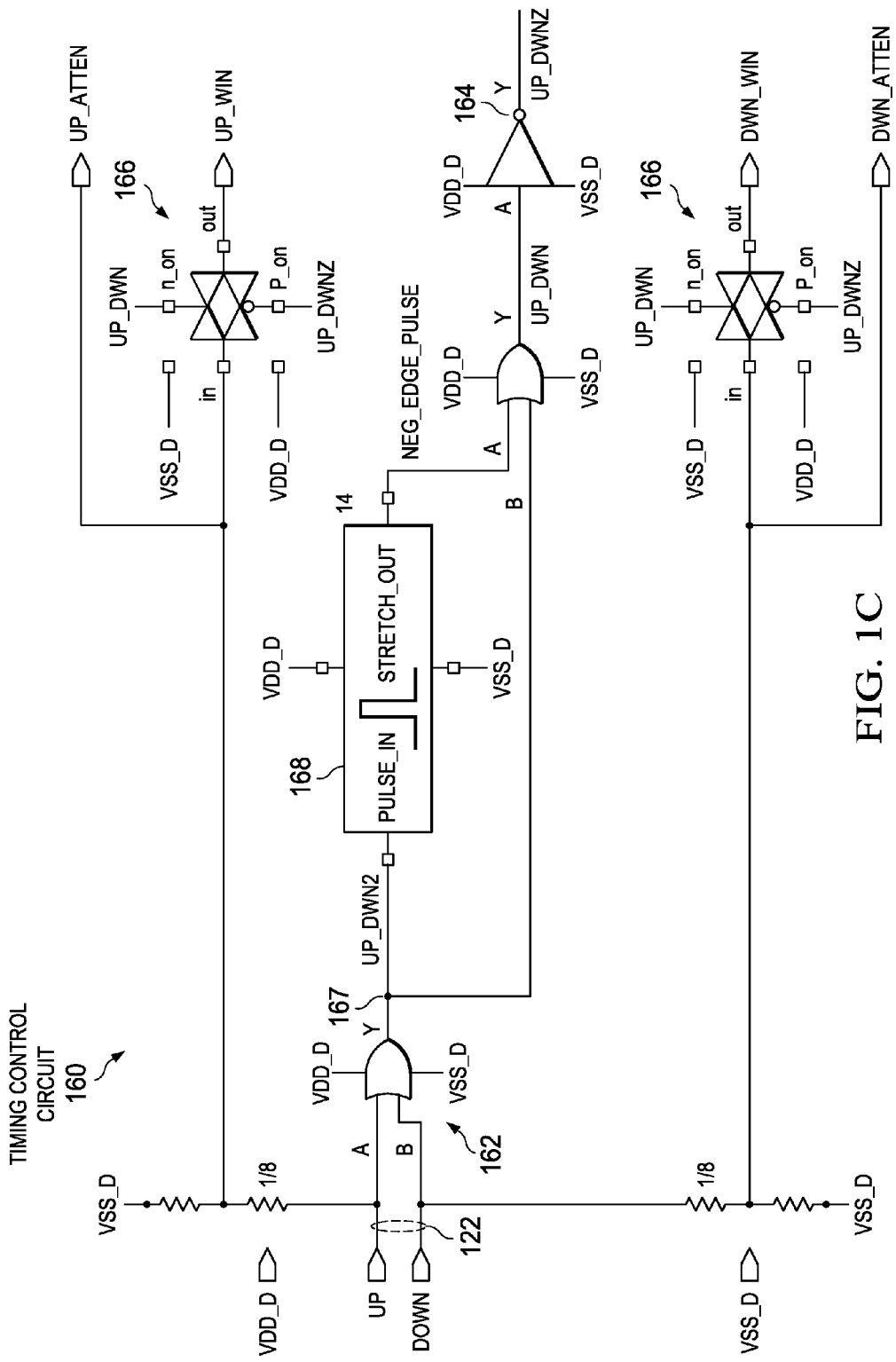
FIG. 1C illustrates a circuit diagram of a timing control circuit described with reference to FIG. 1B, according to an embodiment.

FIG. 1C illustrates a circuit diagram of a timing control circuit 160 described with reference to FIG. 1B, according to an embodiment. To achieve the modulation in the PLL 100, the timing control circuit 160 uses the non-overlapping input signals to generate the control signal 164 to the pair of switches 166 to turn the pair of switches 166 on when a pulse width signal is output by the PD 110 and turn the pair of switches 166 off approximately 10-50 ns after the pulse width signal of the PD 110 is reset. In a particular embodiment, the timing control circuit 160 includes an OR circuit 162 operable to perform an OR operation on the pair of differential input signals 122 and provide an OR output signal 167. Thus, the OR output signal 167 is a logic high when either one of the pair of differential input signals 122 is detected to be present. A stretched out one shot 168 is triggered by a negative edge of the OR output signal 167, the stretched out one shot 168 adding a configurable delay to the negative edge to provide the control signal 164 to control the pair of switches 166. Additional details of the stretched out one shot 168 are described with reference to FIG. 1D.

The configurable delay advantageously enables a charge to be distributed to at least one energy storing element in the feedback circuit 180 and the compensation circuit 190, thereby preserving a transient response of the PLL 100. As described earlier, the configurable delay is adjustable between approximately 10 nanoseconds and approximately 50 nanoseconds. It is understood that a smaller or a larger delay may be configured depending on the application. Additional details of the timing aspects of the timing control circuit 160 are described with reference to FIG. 2C.

Figure 1D:
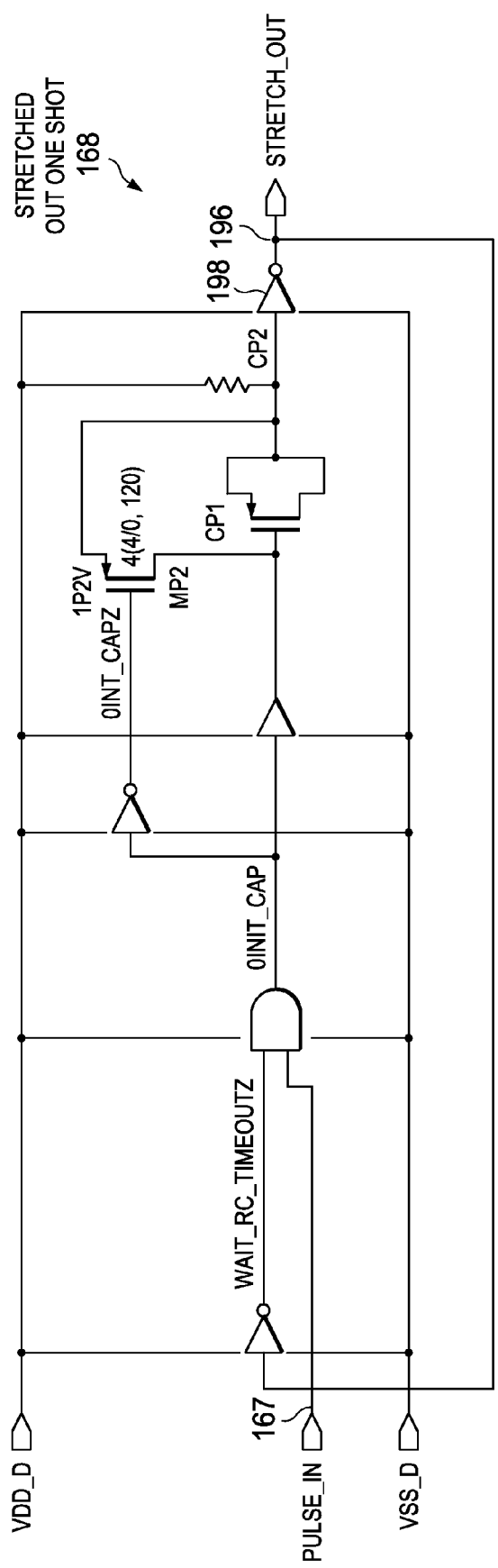
FIG. 1D illustrates a circuit diagram of a stretched out one shot described with reference to FIG. 1C, according to an embodiment.

FIG. 1D illustrates a circuit diagram of a stretched out one shot 168 described with reference to FIG. 1C, according to an embodiment. Operation starts with the high level of the input pulse (from The OR output signal 167) discharging the timing capacitor to the supply level. In this condition the high level output into an output inverter 198 sets an output stretch_out 196 to zero. When the input pulse (from The OR output signal 167) goes low the capacitor starts charging towards the supply and the output stretch_out 196 goes high which then disables any new inputs from triggering the one shot thru the input and gate. Approximately 30 ns (configurable up to approximately 50 ns by configuring value of a resistor) later the threshold of the output inverter 198 is reached and the output stretch_out 196 goes low and enables a new pulse to activate the one shot.

Figure 2A:
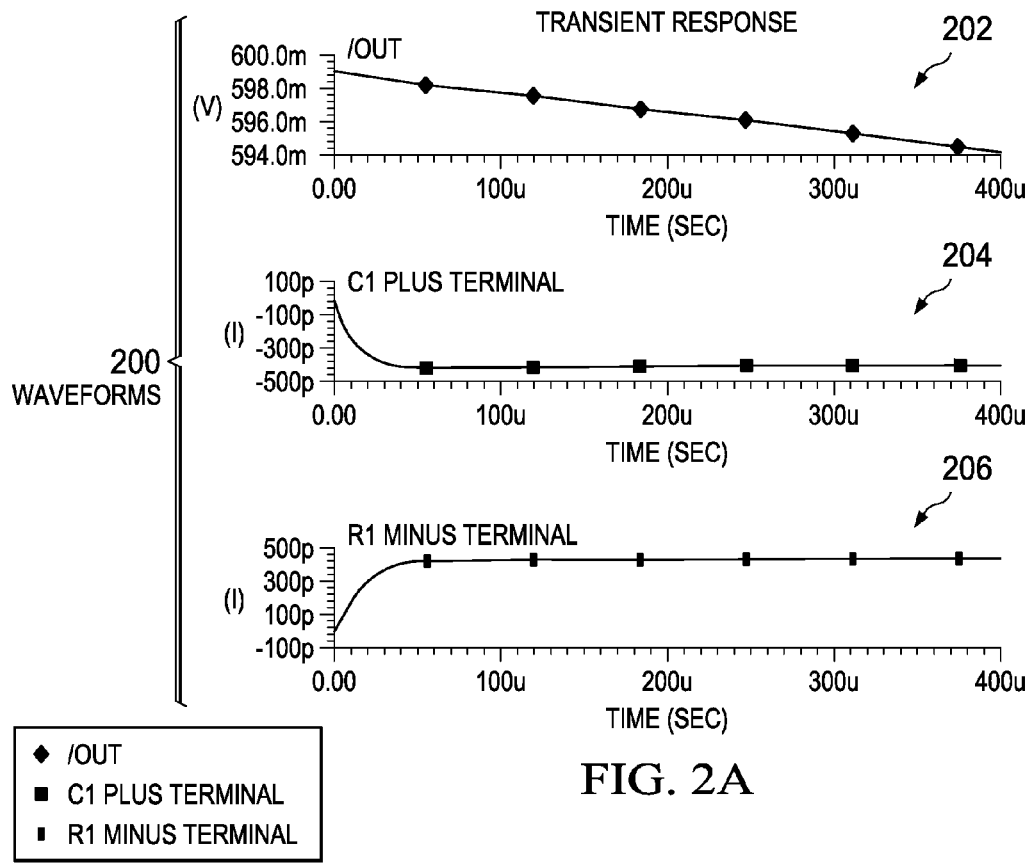
FIG. 2A illustrates transient waveforms associated with current leakage in a traditional phase locked loop (PLL)
Figure 2B:
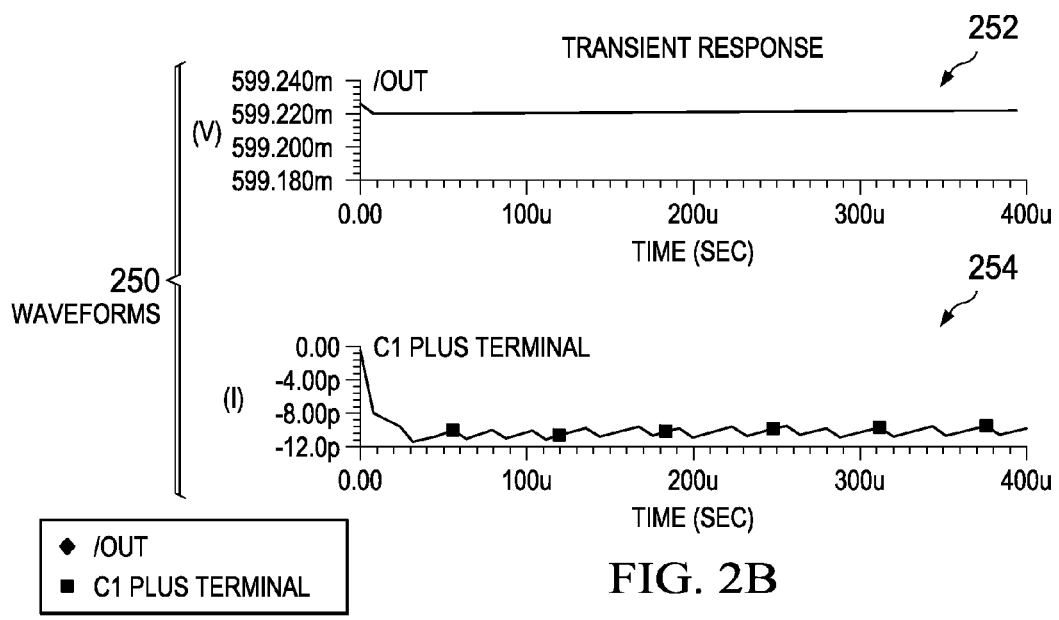
FIG. 2B illustrates transient waveforms associated with current leakage in a phase locked loop (PLL) described with reference to FIGS. 1A, 1B, 1C, and 1D, according to an embodiment.

FIG. 2A illustrates transient waveforms 200 associated with current leakage in a traditional phase locked loop (PLL) and FIG. 2B illustrates transient waveforms 250 associated with current leakage in a phase locked loop (PLL) 100 described with reference to FIGS. 1A, 1B, 1C, and 1D, according to an embodiment. Data used to construct the transient waveforms 200 and 250 described with reference to FIGS. 2A and 2B, is obtained by conducting various types of tests including empirical tests, tests using simulation tools, laboratory tests, and similar others. Configured values for some of the parameters of the PLL 100 include a VCO gain of 100 MHz/V, a PD with a 0.12V/rad gain, a feedback divider with a divide ratio of 1781. The reference input frequency to the PD 110 is 32 kHz and the output frequency of the PLL is 57 MHz. The particular values for the compensation components include R1=1100 kohms, R2=400 kohms, R3=1000 kohms, C1=41 pf, C2=28 pF, and C3=15 pF.

Referring to FIG. 2A, the transient waveforms 200 plotted illustrate the current leakage occurring as a function of time (X-axis) in a traditional PLL (that is a PLL which does not have the benefit of the active loop filter 120 described with reference to FIG. 1B, including the pair of switches 166). Waveform 202 illustrates an output voltage (Y-axis) of an OPAMP as the current leaks off an integrating capacitor in a loop filter. The current leakage occurring in the traditional PLL causes a voltage output provided to the VCO to drop by 0.6 millivolts. Waveform 204 illustrates a current leakage (Y-axis) flowing out of the integrating capacitor. Waveform 206 shows the current leakage (Y-axis) flowing through a series resistor to the grounded output node of a phase detector (PD). The waveform 206 shows a current leakage of approximately 420 pico amperes, causing the 0.6 millivolts drop in voltage provided to the VCO.

Referring to FIG. 2B, the transient waveforms 250 plotted illustrate the current leakage occurring as a function of time (X-axis) in the PLL 100 described with reference to FIGS. 1A, 1B, 1C. Waveform 252 illustrates an output voltage (Y-axis) of the OA output terminal 174 as the current leaks off a capacitor in the feedback circuit 180. The current leakage in the PLL 100 is substantially reduced, thereby causing a voltage output provided to the VCO to drop by only approximately 0.008 mV. Waveform 254 illustrates a current leakage (Y-axis) flowing out of the capacitor in the feedback circuit 180. The current leakage is substantially reduced to only approximately 10 pico amperes when the pair of switches 166 is open, compared to 420 pico amperes in the case of the traditional PLL. Additional detail of the benefits of reducing the current leakage on the performance of the PLL 100 is described with reference to FIGS. 3A and 3B.

Figure 2C:
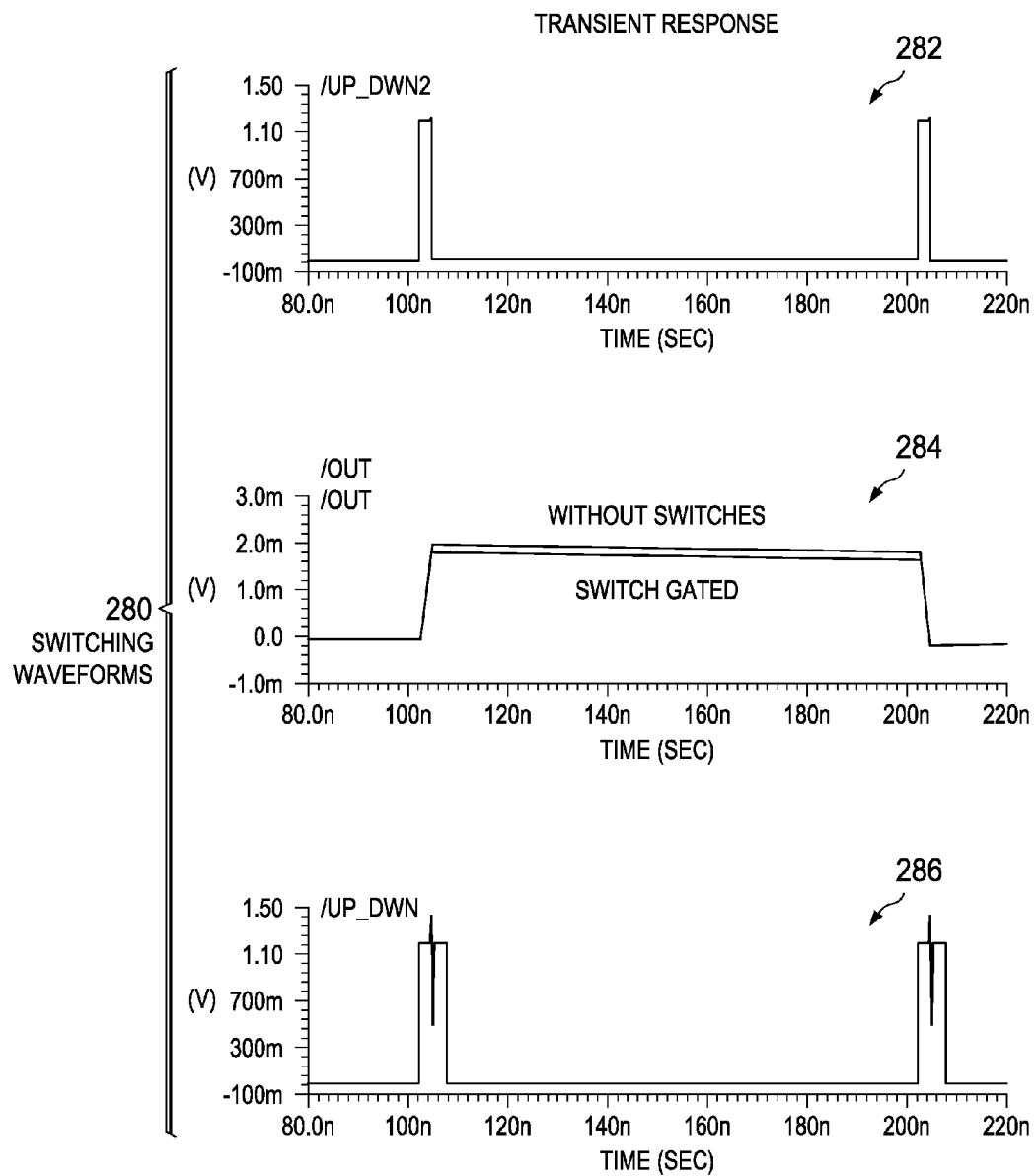
FIG. 2C illustrates switching waveforms associated with a timing control circuit in a phase locked loop (PLL) described with reference to FIGS. 1A, 1B, 1C, and 1D, according to an embodiment.

FIG. 2C illustrates switching waveforms 280 associated with a timing control circuit 160 in a phase locked loop (PLL) 100 described with reference to FIGS. 1A, 1B, 1C, and 1D, according to an embodiment. Waveform 282 illustrates the OR'd output 167 of the non-overlapping pair of differential input signals 122. Waveform 284 shows a voltage output provided to the VCO 130 caused by an up pulse and then 100 ns later followed by a down pulse. The voltage output remains substantially constant, dropping by only about 0.008 mV. Waveform 286 shows the control signal 164 provided to the pair of switches 166. The waveform 286 includes the OR'd up and down output of the PD 110 (shown in waveform 282) combined with the negative edge triggered additional configurable delay introduced by the stretched out one shot 168.

Figure 3A:
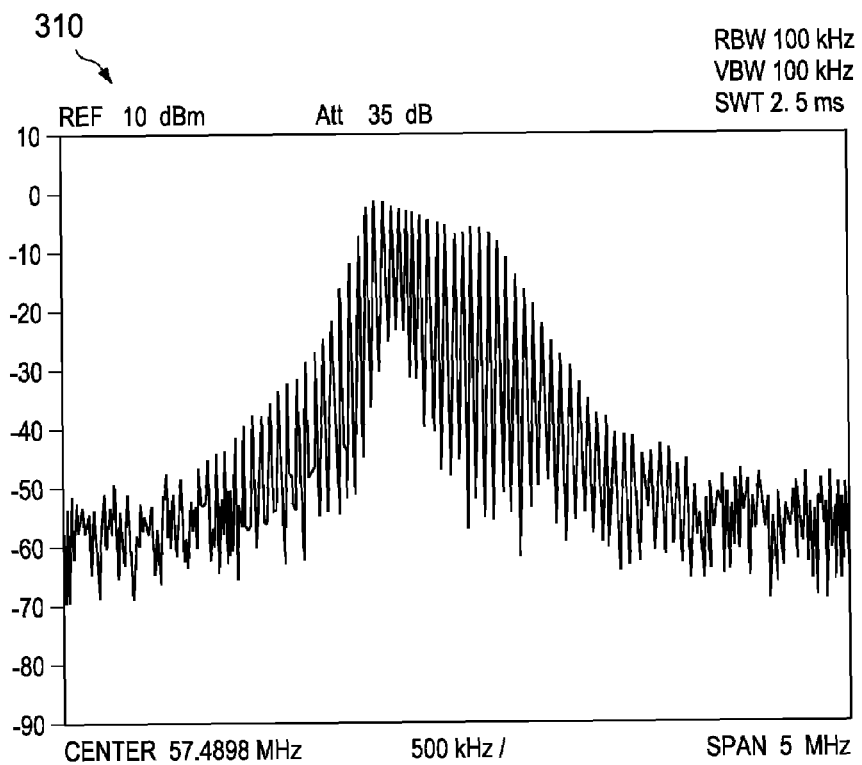
FIG. 3A illustrates in a graphical form a performance of a traditional phase locked loop (PLL)
Figure 3B:
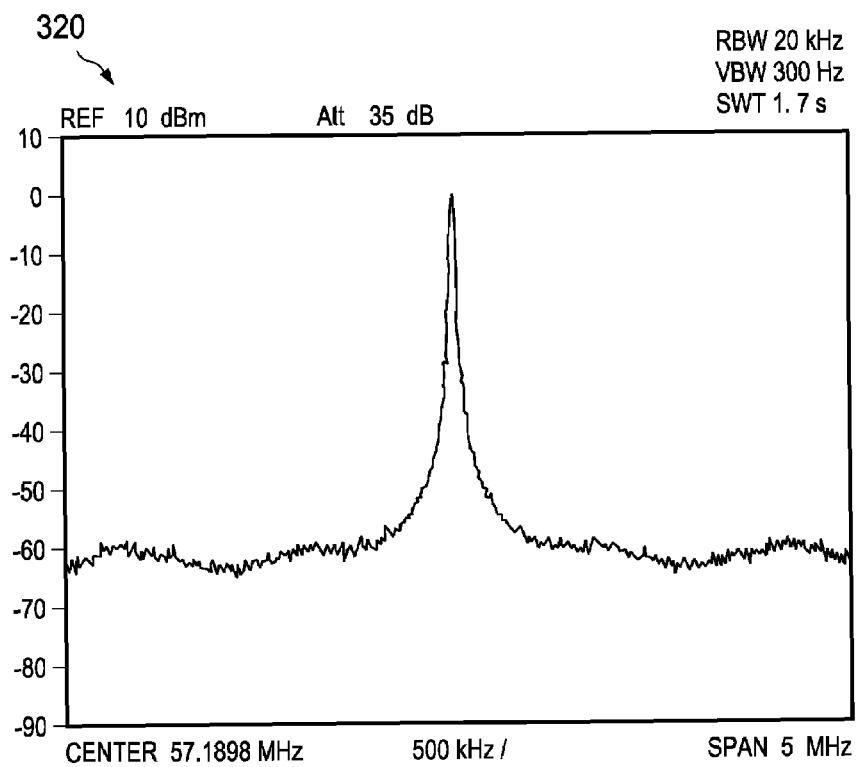
FIG. 3B illustrates in a graphical form an improvement in performance of a phase locked loop (PLL) described with reference to FIGS. 1A, 1B, 1C, and 1D according to an embodiment.

FIG. 3A illustrates in a graphical form a performance of a traditional phase locked loop (PLL) and FIG. 3B illustrates in a graphical form an improvement in performance of a phase locked loop (PLL) 100 described with reference to FIGS. 1A, 1B, 1C, and 1D according to an embodiment. Referring to FIG. 3A, a graph 310 shows a frequency spectrum (which shows a distribution of power spectral density (measured in 10 dB per division along Y-axis) as a function of frequency (500 KHz per division along X-axis)) of an output signal of the traditional PLL (that is a PLL which does not have the benefit of the active loop filter 120 described with reference to FIG. 1B, including the pair of switches 122). The graph 310 has a 0 dBc reference sideband level, which causes a wide banded frequency modulated spectrum with 800 kHz of frequency spread.

Referring to FIG. 3B, a graph 320 shows a frequency spectrum of an output of the PLL 100. The magnitude scale (Y-axis), the frequency scale (X-axis), the resolution bandwidth, and the video bandwidth of graphs 310 and 320 are matched for a direct comparison. The graph 320 shows the PLL 100 dramatically eliminates 800 kHz FM frequency spread and produces reference sideband tones only −38 dBc at 32 kHz offset from the 57 MHz output. Therefore, a reduction in the current leakage contributes to a substantial performance improvement (e.g., approximately 35-40 dB) in PLL performance.

Figure 4:
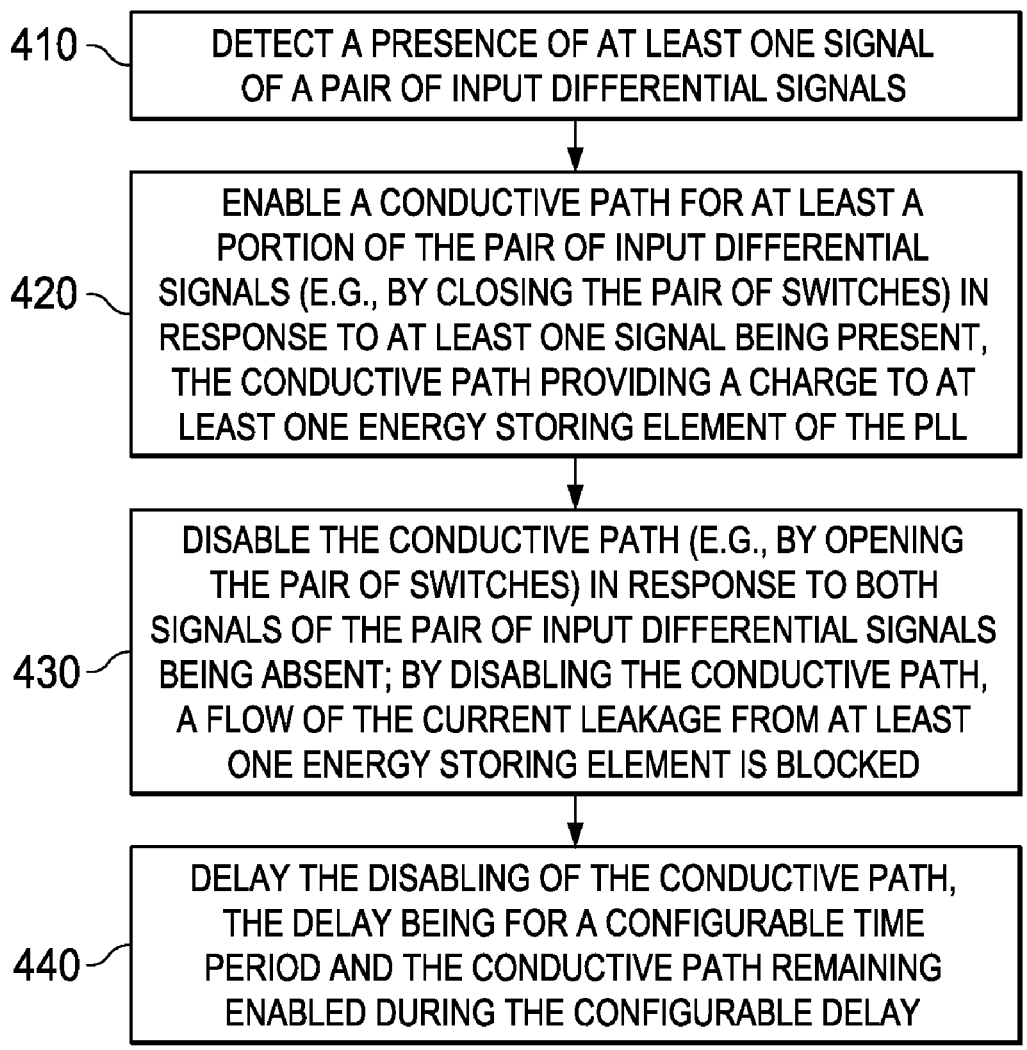
FIG. 4 is a flow chart illustrating a method for reducing current leakage in a phase locked loop (PLL), according to an embodiment.

FIG. 4 is a flow chart illustrating a method for reducing current leakage in a phase locked loop (PLL), according to an embodiment. In a particular embodiment, the method is used to reduce the current leakage in the PLL 100 described with reference to FIGS. 1A, 1B, 1C, 1D, 2A, 2B, 2C, 3A, and 3B. At step 410, a presence of at least one signal of a pair of input differential signals is detected. At step 420, a conductive path for at least a portion of the pair of input differential signals is enabled (e.g., by closing the pair of switches) in response to the at least one signal being present, the conductive path providing a charge to at least one energy storing element of the PLL. At step 430, the conductive path is disabled (e.g., by opening the pair of switches) in response to both signals of the pair of input differential signals being absent. By disabling the conductive path, a flow of the current leakage from the at least one energy storing element is blocked.

Various steps described above may be added, omitted, combined, altered, or performed in different orders. For example, step 440 may be added to delay the disabling of the conductive path described with reference to step 430. The delay is for a configurable time period and the conductive path remains enabled during the configurable delay.

Several advantages are achieved by the method and apparatus according to the illustrative embodiments presented herein. The embodiments provide an improved active compensation PLL that retains the benefits of the traditional active compensation PLL such as improved loop stability, increased gain, narrower loop bandwidth, and higher noise immunity, and in addition advantageously reduces the current leakage, thereby improving the PLL performance. A pair of switches is used to advantageously block the leakage current when there is no signal from the PD, thereby reducing the current leakage and substantially reducing presence of reference sidebands by approximately 38 dB. The virtual elimination of the reference sidebands, which are present in a traditional PLL without the pair of switches, substantially reduces an unusable wideband modulation signal generated by the PLL without the pair of switches to a usable narrow band modulation signal.

Although illustrative embodiments have been shown and described, a wide range of modification, change and substitution is contemplated in the foregoing disclosure and in some instances, some features of the embodiments may be employed without a corresponding use of other features. Those of ordinary skill in the art will appreciate that the hardware and methods illustrated herein may vary depending on the implementation. For example, while certain aspects of the present disclosure have been described in the context of an active loop filter used in a PLL, the loop filter may be used for, among other things, frequency synthesis, frequency multiplication, pulse synchronization, tone decoding, AM and FM modulation and demodulation, phase modulation and demodulation, and delay locked loop (DLL). These types of applications are widely used in communications (wired and wireless), and computers. As another example, while certain aspects of the present disclosure have been described in the context of a differential input signal, it is understood that the methods and circuits described herein are also applicable to single ended inputs.

The methods and systems described herein provide for an adaptable implementation. Although certain embodiments have been described using specific examples, it will be apparent to those skilled in the art that the invention is not limited to these few examples. The benefits, advantages, solutions to problems, and any element(s) that may cause any benefit, advantage, or solution to occur or become more pronounced are not to be construed as a critical, required, or an essential feature or element of the present disclosure.

The above disclosed subject matter is to be considered illustrative, and not restrictive, and the appended claims are intended to cover all such modifications, enhancements, and other embodiments, which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. An active loop filter comprising:
   a pair of resistive divider circuit coupled to receive a pair of differential input signals and provide a pair of differential output signals;
   a timing control circuit to control a pair of switches, the pair of switches being operable to conduct the pair of differential output signals in response to at least one signal of the pair of differential input signals being present;
   an operational amplifier (OA) having a pair of OA input terminals and an OA output terminal, wherein the pair of OA input terminals is coupled to receive the pair of differential output signals conducted by the pair of switches; and
   a feedback circuit coupled between the OA output terminal and a first one of the pair of OA input terminals, wherein the pair of switches are disabled to block a current leakage from the feedback circuit.

2. The active loop filter of claim 1, further comprising:
   a pair of differential input resistors coupled between the pair of switches and the pair of OA input terminals;
   a pair of third resistance and capacitor circuit coupled in parallel across a corresponding combination of the pair of switches and the pair of differential input resistors; and
   a compensation circuit coupled between a second one of the pair of OA input terminals and a voltage reference, wherein the pair of switches are disabled to block the current leakage from the compensation circuit flowing through the pair of differential input resistors.

3. The active loop filter of claim 2, wherein each one of the compensation circuit and the feedback circuit includes at least one capacitor and at least one resistor, wherein the current leakage from the at least one capacitor through the pair of differential input resistors is blocked by the pair of switches.

4. The active loop filter of claim 1, wherein the pair of switches is disabled in response to both signals of the pair of differential input signals being absent.

5. The active loop filter of claim 1, wherein the timing control circuit includes:
   an OR circuit operable to perform an OR operation on the pair of differential input signals and provide an OR output signal; and
   a stretched out one shot triggered by a negative edge of the OR output signal, the stretched out one shot adding a configurable delay to the negative edge to provide a control output signal to control the pair of switches.

6. The active loop filter of claim 5, wherein the configurable delay enables a charge to be distributed to at least one energy storing element in the feedback circuit.

7. The active loop filter of claim 5, wherein the configurable delay is adjustable between approximately 10 nanoseconds and approximately 50 nanoseconds.

8. The active loop filter of claim 1, wherein the pair of differential input signals are non-overlapping.

9. The active loop filter of claim 1, wherein the pair of differential output signals are configurable as a proportional ratio of the pair of differential input signals, wherein the proportional ratio is configurable to reduce a toggling effect on an OA output signal provided at the OA output terminal in response to a change of both signals of the pair of differential input signals.

10. A phased lock loop (PLL) comprising:
   a phase detector (PD) to compare a feedback signal and a reference signal, the PD generating an error signal corresponding to a difference between the feedback signal and the reference signal;
   an active loop filter including:
   a pair of resistive divider circuit coupled to receive a pair of differential input signals indicative of the error signal and provide a pair of differential output signals;
   a timing control circuit to selectively control a pair of switches, the pair of switches being operable to conduct the pair of differential output signals in response to at least one signal of the pair of differential input signals being present;
   an operational amplifier (OA) having a pair of OA input terminals and an OA output terminal, wherein the pair of OA input terminals is coupled to receive the pair of differential output signals as conducted by the pair of switches;
   a feedback circuit coupled between the OA output terminal and a first one of the pair of OA input terminals, wherein the pair of switches are disabled to block a current leakage from the feedback circuit; and
   a voltage controlled oscillator (VCO) having a VCO input and a VCO output, wherein the VCO input is coupled to the OA output terminal, the VCO output being used to derive the feedback signal.

11. The PLL of claim 10, further comprising:
   a pair of differential input resistors coupled between the pair of switches and the pair of OA input terminals;
   a pair of third resistance and capacitor circuit coupled in parallel across a corresponding combination of the pair of switches and the pair of differential input resistors; and
   a compensation circuit coupled between a second one of the pair of OA input terminals and a voltage reference, wherein the pair of switches are disabled to block the current leakage from the compensation circuit flowing through the pair of differential input resistors.

12. The PLL of claim 11, wherein each one of the compensation circuit and the feedback circuit include at least one capacitor and at least one resistor, wherein the current leakage from the at least one capacitor through the pair of differential input resistors is blocked by the pair of switches.

13. The PLL of claim 10, wherein a blockage of the current leakage causes the current leakage to reduce, thereby resulting in the VCO output having reduced reference sideband levels compared to a PLL without the pair of switches.

14. The PLL of claim 13, wherein a reduction in the reference sideband levels is approximately 38 dB, thereby reducing an unusable wideband modulation signal provided by the PLL without the pair of switches to a usable narrow band modulation signal generated at the VCO output.

15. The PLL of claim 10, wherein the timing control circuit includes:
   an OR circuit operable to perform an OR operation on the pair of differential input signals and provide an OR output; and
   a one shot triggered by a negative edge of the OR output, the one shot adding a configurable delay to the negative edge to provide a control output to control the pair of switches.

* * * * *